United States Patent
Ozawa et al.

(10) Patent No.: US 7,264,980 B2
(45) Date of Patent: *Sep. 4, 2007

(54) METHOD OF MOUNTING LIGHT EMITTING ELEMENT

(75) Inventors: Masafumi Ozawa, Kanagawa (JP); Hiroshi Yoshida, Kanagawa (JP); Takashi Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/348,210

(22) Filed: Feb. 6, 2006

(65) Prior Publication Data

US 2006/0128043 A1 Jun. 15, 2006

Related U.S. Application Data

(63) Continuation of application No. 10/225,733, filed on Aug. 22, 2002, now Pat. No. 6,998,279.

(30) Foreign Application Priority Data

Aug. 23, 2001 (JP) .............................. 2001-252443
Jul. 30, 2002 (JP) .............................. 2002-221070

(51) Int. Cl.
*H01L 21/00* (2006.01)
*H01L 29/26* (2006.01)

(52) U.S. Cl. ..................... 438/26; 438/116; 438/125; 257/80; 257/81; 257/98; 257/434; 257/E31.127

(58) Field of Classification Search ..................... None
See application file for complete search history.

(56) References Cited

U.S. PATENT DOCUMENTS 5,563,422 A 10/1996 Nakamura et al.
6,093,965 A 7/2000 Nakamura et al.
6,121,636 A 9/2000 Morita et al.
6,255,129 B1 7/2001 Lin
6,323,059 B1 11/2001 Yoshida et al.

(Continued)

FOREIGN PATENT DOCUMENTS

| EP | 1126526 | 8/2001 |
|---|---|---|
| JP | 359080980 | 5/1984 |
| JP | 405259579 | 10/1993 |
| JP | 405335355 | 12/1993 |
| JP | 406232506 | 8/1994 |
| JP | 07038201 | 2/1995 |
| JP | 0200114595 | 4/2000 |
| JP | 2001135885 | 5/2001 |
| JP | 2001230502 | 8/2001 |

*Primary Examiner*—Alonzo Chambliss
(74) *Attorney, Agent, or Firm*—Robert J. Depke; Rockey, Depke, Lyons & Kitzinger, LLC.

(57) ABSTRACT

The present invention provides a method of mounting a light emitting element, in which a light emission point can be positioned at high accuracy with respect to the mounting member. A semiconductor laser element is placed on a matching stage. Next, a position and an azimuth of a laser stripe of the semiconductor laser element is observed, and linear displacement in X and Y directions of the semiconductor laser element from a reference line and a reference point on the matching stage, and angular displacement in an azimuth (θ) within an X-Y plane are measured. In accordance with a measured result, a control signal is sent to a driving mechanism of the feeding collet to drive the feeding collet, and the position of the semiconductor laser element is adjusted on the matching stage. After the adjustment, the semiconductor laser element is fed to and placed on a mounting surface of a heat sink H.

8 Claims, 7 Drawing Sheets

U.S. PATENT DOCUMENTS

| | | |
|---|---|---|
| 6,420,736 B1 | 7/2002 | Chen et al. |
| 6,440,758 B1 * | 8/2002 | Tamaishi et al. .............. 438/7 |
| 6,468,821 B2 | 10/2002 | Maeda et al. |
| 6,474,531 B2 | 11/2002 | Ozawa |
| 6,479,325 B2 | 11/2002 | Ozawa |
| 6,479,889 B1 | 11/2002 | Yoshida et al. |
| 6,627,521 B2 * | 9/2003 | Furukawa et al. .......... 438/481 |
| 6,777,792 B2 | 8/2004 | Yoshida et al. |
| 6,998,279 B2 * | 2/2006 | Ozawa et al. ................. 438/26 |

* cited by examiner

METHOD OF MOUNTING LIGHT EMITTING ELEMENT

CROSS REFERENCES TO RELATED APPLICATIONS

The subject matter of application Ser. No. 10/225,733 is incorporated herein by reference. The present application is a continuation of U.S. application Ser. No. 10/225,733, filed Aug. 22, 2002, now U.S. Pat. No. 6,998,279, which claims priority to Japanese Patent Application No. JP2001-252443, filed Aug. 23, 2001, and Japanese Patent Application No. JP2002-221070, filed Jul.30, 2002. The present application claims priority to these previously filed applications.

BACKGROUND OF THE INVENTION

1. Field of the Invention

The present invention relates to a method of mounting a light emitting element, such as a semiconductor laser element, a light emitting diode or the like, which is formed on a transparent substrate. More particularly, the present invention relates to a method of positioning and mounting a light emitting element on a mounting member so that a light emission point of the light emitting element is accurately positioned at a predetermined position.

2. Description of Related Art

Conventionally, in a light emitting device such as a semiconductor laser device, a light emitting diode and the like, a light emitting element in the form of a chip is relatively small. In order to protect the element from external force and because of its mounting procedure and its usage, it is usually mounted on an apparatus after mounted on a holder member or a mounting member larger than the light emitting element itself. Also, since the light emitting device is a heat generator, it is necessary to radiate the heat generated therefrom.

For those reasons, the light emitting device is used in a condition that the light emitting element thereof is mounted on a mounting member such as a sub mount, a heat sink or the like, in many cases.

Conventionally, when the light emitting element is mounted on a mounting surface of a necessary mounting member, for example, on a mounting surface of a heat sink, a sub mount, an LOP (Laser On Photodiode) or the like, an outer contour of the light emitting element or an electrode pattern or a marker put on the light emitting element is used as a reference point or a reference line. The light emitting element is visually position-matched with the reference position of the mounting member and fixed thereon. For example, a cross-shaped marker is put on a side of a laser stripe of the light emitting element, and this is used as the reference point.

Figure 5:
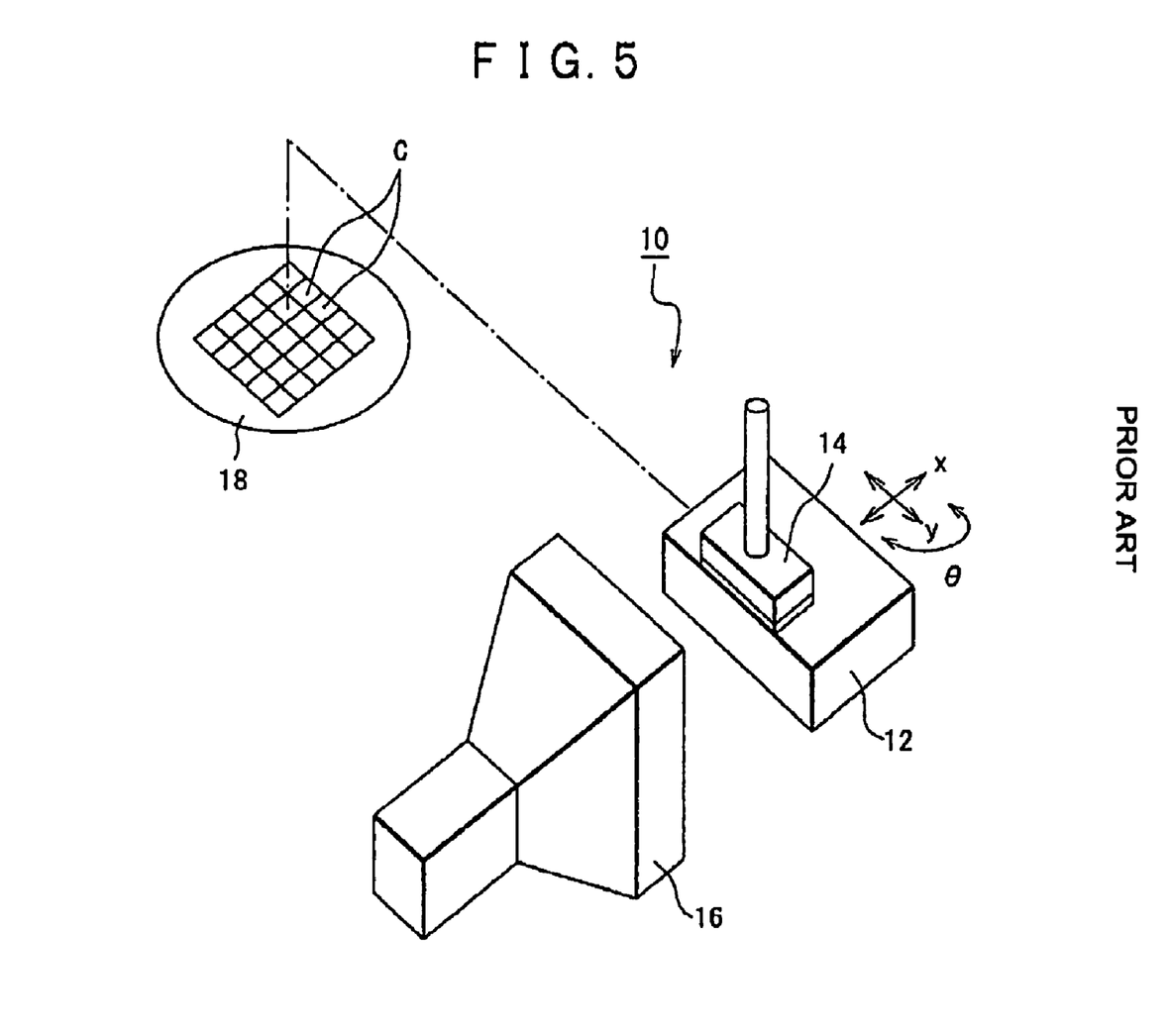
FIG. 5 is a schematic perspective view showing a configuration of an example of a mounting apparatus used in a conventional mounting method.

Here, a conventional method of mounting a light emitting element is explained by exemplifying an operation for mounting a light emitting element on a heat sink. First, the configuration of a mounting apparatus used when a semiconductor laser element is mounted is described with reference to FIG. 5. A mounting apparatus 10 comprises a position-matching stage (hereafter, referred to as a matching stage) 12 having an X-Y plane, a feeding collet 14 and an image sensor 16, as shown in FIG. 5.

The matching stage 12 is placed at a position separated by a predetermined distance in a predetermined azimuth with respect to a heat sink (not shown) on which a semiconductor laser element C is mounted. The feeding collet 14 sucks and holds the semiconductor laser element C, one by one, from a tray or sheet 18 on which a plurality of chip-shaped semiconductor laser elements C are aligned, and then feeds to and places it on the matching stage 12.

Moreover, while sucking and holding the semiconductor laser element C on the matching stage 12, the feeding collet 14 is driven by a driving mechanism (not shown) and freely moved in an X-direction, a Y-direction and a θ-azimuth on the matching stage 12 to thereby adjust the position and the azimuth of the semiconductor laser element C.

The image sensor 16 is, for example, a CCD camera. It recognizes the marker put on the semiconductor laser element C or the outer contour thereof, and detects displacement in the azimuth θ and in the position on the X-Y plane of the semiconductor laser element C from the reference line and the reference point on the X-Y plane of the matching stage 12.

Next, the image sensor 16 sends the displacement information of the azimuth and the position to the driving mechanism of the feeding collet 14, and the feeding collet 14 is driven to correctly adjust the azimuth and the position of the semiconductor laser element C on the matching stage 12.

The feeding collet 14 sucks the semiconductor laser element C after the displacement in the azimuth and in the position are eliminated, and moves it by a predetermined distance in a predetermined direction, and then places it on the mounting member.

The method of mounting the semiconductor laser element C on the heat sink using the mounting apparatus 10 will be described below with reference to FIG. 5. First, the semiconductor laser element C is picked up, one by one, from the tray or sheet 18, on which the plurality of chip-shaped semiconductor laser elements C are aligned, using the feeding collet 14, and then fed to and placed on the matching stage 12.

Next, displacement of the semiconductor laser element C from the reference lines on the matching stage 12, namely, the displacement in the X-direction and the Y-direction (hereinafter, referred to as "linear displacement"), and displacement in the rotational direction within the X-Y plane, namely, the azimuth (θ) (hereinafter, referred to as "angular displacement"), are measured by measuring the marker put on the semiconductor laser element C or the outer contour of the semiconductor laser element C through the image sensor 16.

In accordance with the measured linear displacement in the X-direction and the Y-direction and the measured angular displacement of the rotational direction (θ) within the X-Y plane, a control signal is outputted to a driving mechanism (not shown) of the feeding collet 14, and the feeding collet 14 is driven to thereby correctly adjust the position of the semiconductor laser element C on the matching stage 12.

Next, the semiconductor laser element C after the adjustment in the position and the azimuth is held by the feeding collet 14, and fed to a mounting surface of the heat sink (not shown). The heat sink for mounting the semiconductor laser element C is positioned in advance at a position separated in a predetermined azimuth by a predetermined distance from the matching stage 12. Thus, the semiconductor laser element C is accurately positioned in the condition that it is fed to the mounting surface of the heat sink. Subsequently, the semiconductor laser element C is fixed on the heat sink.

The most important condition when a semiconductor laser element is positioned on a mounting member such as a heat sink or the like is to accurately position the light emission point of the semiconductor laser element with respect to the mounting member.

However, in view of this, the above-mentioned conventional method of mounting the light emitting element has the following problems.

Firstly, when the semiconductor laser element is position-matched using the matching marker put on the semiconductor laser element as a reference, it is not possible to position the light emission point of the semiconductor laser element with respect to the heat sink at high accuracy if the positioning accuracy between the light emission point of the semiconductor laser element and the marker is insufficient. Actually, it is very difficult to precisely position the marker with respect to the light emission point. Thus, it has been difficult to improve the positioning accuracy of the semiconductor laser element.

When the marker is put on the semiconductor laser element, if the laser stripe and the marker can be formed using a single mask as the mask to form the laser stripe, it is possible to form the marker at high accuracy with respect to the laser stripe. However, it is not always easy practically. Moreover, even if the marker and the laser stripe are formed using the single mask, there may be a case that a marker pattern is broken. Under the above-mentioned situation, it is difficult to position-match the light emission point with the mounting member at high accuracy and then mount the semiconductor laser element on the mounting member.

Even if the marker is put on the semiconductor laser element, in a case where the semiconductor laser element is mounted on the heat sink with reference to a marker of a sub mount after a semiconductor laser element chip is once mounted on the sub mount, it is not possible to mount the semiconductor laser element at high accuracy.

Secondly, the shape and the dimensions of the outer contour of the semiconductor laser element cannot be accurately adjusted. Thus, even if the outer contour of the semiconductor laser element is used as the reference so as to match with the mounting member, it is difficult to improve the positioning accuracy of the light emission point of the semiconductor laser element with respect to the mounting member. In particular, in a case of a GaN-based semiconductor laser element formed on a sapphire substrate, when a number of semiconductor laser elements formed on a wafer are made into chips, cleavability of the wafer is poor. Thus, it is difficult to cleave the wafer and make it into chips. Hence, an etching process, a dicing process and the like are used for making the wafer into the chips. Consequently, the outer contour of the chip is deviated from a predetermined contour, in many cases. Hence, the positioning accuracy becomes poor when the outer contour of the chip is used as the reference to thereby position-match with the mounting member.

Thirdly, there is also a problem that it takes a long time to position-match the semiconductor laser elements.

In the above-mentioned explanation, the problems have been explained by exemplifying the semiconductor laser element. However, those problems are pointed out even in a case of the light emitting diode. That is, these problems are pertinent generally to the light emitting elements.

SUMMARY OF THE INVENTION

In view of these problems, the present invention was made to provide a method of mounting a light emitting element, in which a light emission point can be positioned at a high accuracy with respect to a mounting member, when the light emitting element is mounted on the mounting member.

In a case of the semiconductor laser element formed on a transparent substrate, such as a GaN-based semiconductor laser element formed on a sapphire substrate, a laser stripe can be identified from the transparent substrate side. The Inventors hit on an idea to use it as a reference line and carry out a positioning operation. Moreover, the Inventors hit on an idea to apply an electric current to the semiconductor laser element so as to make the laser stripe emit lights as if it is an emission line, to identify the laser stripe from the transparent substrate side, and to carry out the positioning operation using it as the reference line. Then, the Inventors confirmed this effectiveness from experiments, which lead to the present invention.

First Method of the Present Invention

In consideration of the above-mentioned viewpoints, a method of mounting a light emitting element according to the present invention (hereafter, referred to as a first method) is provided as a method of mounting a light emitting element formed on a transparent substrate, on a mounting member. The method comprises the steps of: placing the light emitting element on a matching stage arranged in a predetermined position relative to the mounting member; measuring linear displacement and angular displacement of a light emission stripe of the light emitting element from a reference line of the matching stage; adjusting a position and an azimuth of the light emitting element on the matching stage, in accordance with the measured linear displacement and angular displacement of the light emission stripe; and moving the light emitting element after the position and the azimuth are adjusted, onto the mounting member, correspondingly to positional relation between the mounting member and the matching stage, and positioning the light emitting element on the mounting member.

Second Method of the Present Invention

Moreover, a preferable method is another method of mounting a light emitting element according to the present invention (hereafter, referred to as a second method). The second method is also a method of mounting a light emitting element formed on a transparent substrate, on a mounting member. The method comprises the steps of: bringing one of electrodes of the light emitting element into contact with a conductive matching stage arranged in a predetermined position relative to the mounting member so as to place the light emitting element thereon; applying a current between electrodes of the light emitting element through the matching stage, and indicating a light emission stripe of the light emitting element to emit lights in an emission line condition; measuring linear displacement and angular displacement of the light emission stripe in the emission line condition from a reference line of the matching stage; adjusting a position and an azimuth of the light emitting element on the matching stage, in accordance with the measured linear displacement and angular displacement of the light emission stripe; and moving the light emitting element after the position and the azimuth are adjusted, onto the mounting member, correspondingly to a positional relation between the mounting member and the matching stage, and positioning the light emitting element on the mounting member.

The transparent substrate of the first method of the present invention is a substrate that is transparent to visible light and to light having a wave length of a part of the visible light.

The transparent substrate of the second method of the present invention is a substrate that is transparent to visible light and to light having a wave length of a part of the visible light, and that is transparent to light emitted by the light emitting element.

The first method can be applied without any limitation on the composition and the film thickness of a compound semiconductor layer constituting a lamination structure of the light emitting element, as long as the lamination structure of the light emitting element formed on the transparent substrate is transparent. Also, the second method can be applied without any limitation on the composition and the film thickness of a compound semiconductor layer constituting a lamination structure of the light emitting element, as long as the light emitting element is formed on the transparent substrate.

Figure 6:
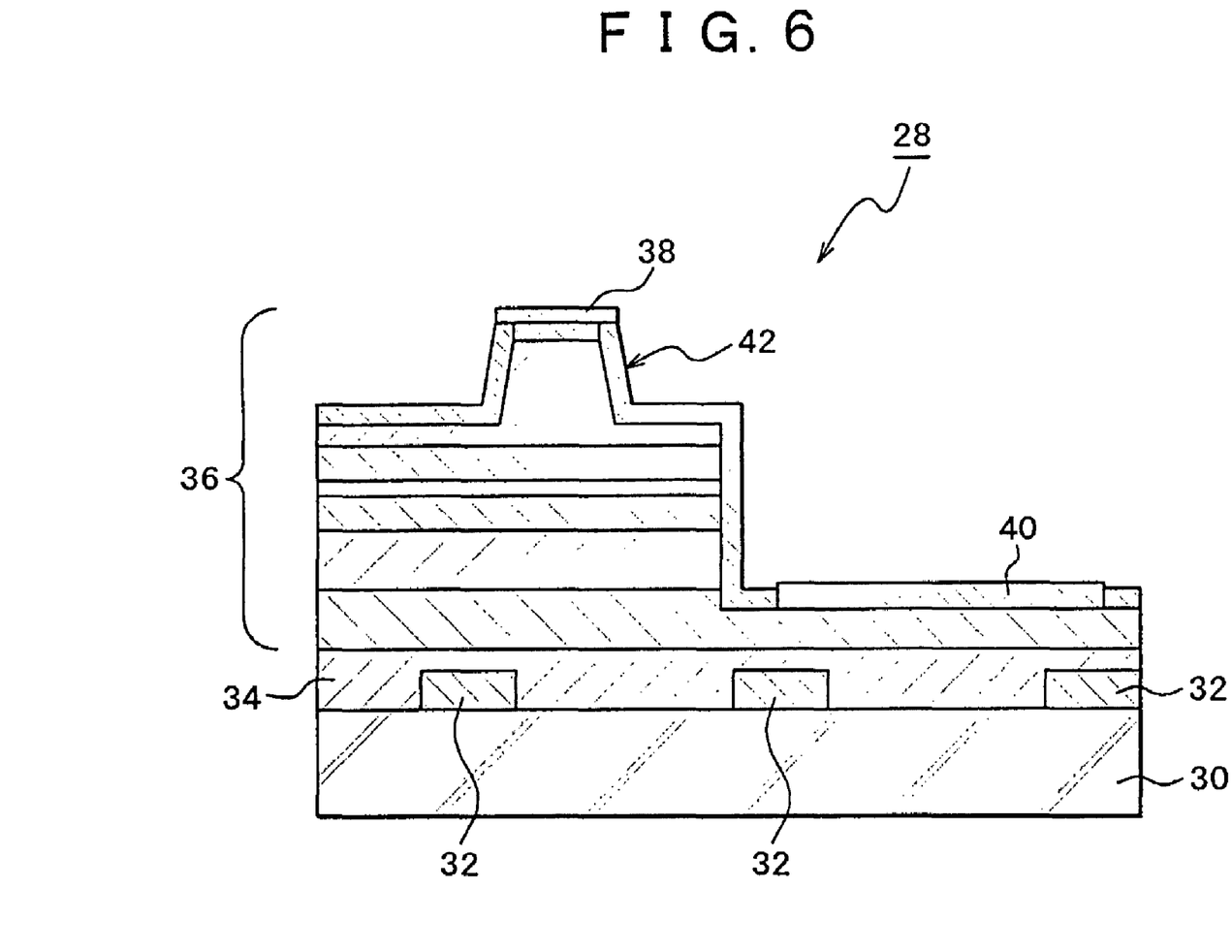
FIG. 6 is a sectional view showing a configuration of a GaN-based semiconductor laser element.

In a case where, as shown in FIG. 6, a GaN-based semiconductor laser element 28 is formed on a sapphire substrate 30, a ridge 32 is firstly formed on the sapphire substrate 30. Next, a GaN bulk layer 34 is grown on the ridge 32 by a laterally growing method. In addition, a laminated structure 36 comprising a GaN-based compound semiconductor layer and electrodes 38, 40 are formed on the GaN bulk layer 34.

A laser stripe 42 of the GaN-based semiconductor laser element 28 is formed between the ridges 32 in a situation positioned at high accuracy with respect to the ridge 32, as shown in FIG. 6. As for the laser stripe 42, a position of a light emission point is defined in an active region immediately under it, and accurately positioned with respect to the ridge 32. In other words, the ridge 32 has accurate positional relation to the light emission point.

In addition, the sapphire substrate 30 and the laminated structure 36 are transparent. Thus, the ridge 32 formed on the sapphire substrate 30 can be easily visually identified from an external portion even after the formation of the GaN-based semiconductor laser element 28. The Inventors had an idea that this ridge 32 can be used as the reference line of the GaN-based semiconductor laser element 28, differently from the first and second methods of the present invention.

Figure 7A:
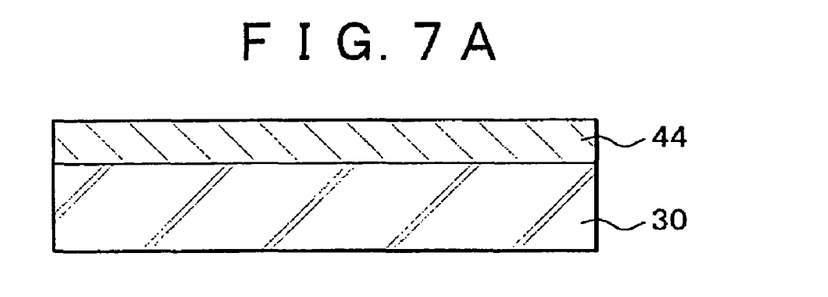
FIGS. 7A to 7D are sectional views for each step for forming a ridge.
Figure 7B:
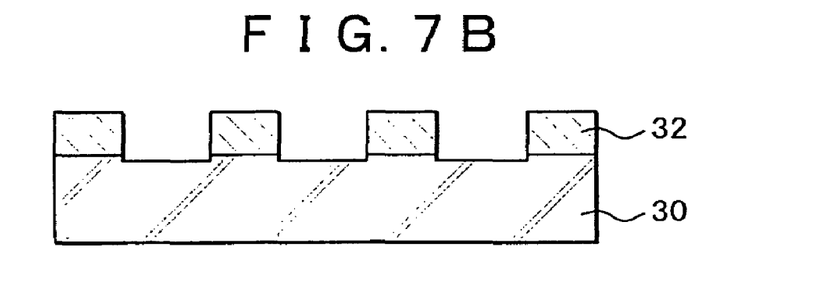
Figure 7C:
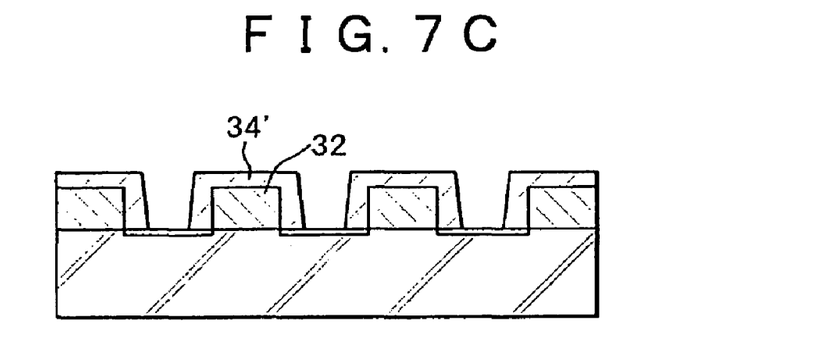
Figure 7D:
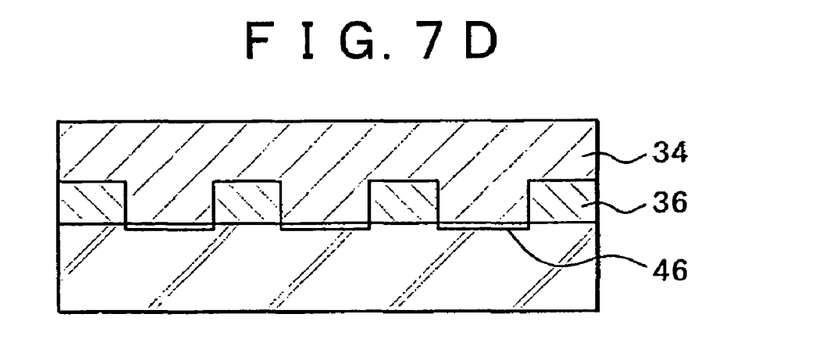

When the GaN bulk layer 34 is grown, a GaN layer 44 is firstly grown on the sapphire substrate 30 as shown in FIG. 7A. Then, as shown in FIG. 7B, the GaN layer 44 and the upper layer of the sapphire substrate 30 are etched to periodically form grooves and thereby form the line-shaped ridges 32. Next, as shown in FIG. 7C, the laterally growing method is used to grow a GaN bulk layer 34' and fill the ridge 32. Also, it is upwardly grown to thereby form the GaN bulk layer 34 as shown in FIG. 7D. Incidentally, the GaN bulk layer 34' indicates the grown layer in the course of the lateral growth. A reference numeral 46 denotes the gap formed between the GaN bulk layer 34 and the sapphire substrate 30.

Since the sapphire substrate 30 is transparent, a line-shaped ridge 32 can be identified from a rear plane of the substrate. The Inventors hit on an idea that the line-shaped ridge can be used as the marker. As a result of an experiment, it is determined to be effective, which leads to the present invention.

Still another method of mounting a light emitting element according to the present invention (hereafter, referred to as a third method) is a method of mounting a GaN-based light emitting element formed on a ridge placed on a sapphire substrate, on a mounting member. The method comprises the steps of: placing the light emitting element on a matching stage arranged in a predetermined position relative to the mounting member; measuring linear displacement and angular displacement of the ridge of the light emitting element from a reference line of the matching stage; adjusting a position and an azimuth of the light emitting element on the matching stage, in accordance with the measured linear displacement and angular displacement of the ridge; and moving the light emitting element after the position and the azimuth are adjusted, onto the mounting member, correspondingly to the positional relation between the mounting member and the matching stage, and positioning the light emitting element on the mounting member.

The transparent substrate of the third method is a substrate that is transparent to visible light and to light having a wave length of a part of the visible light.

In the first to third methods of the present invention, there is no limitation on the method of measuring the linear displacement and the angular displacement of the light emission stripe or the ridge from the reference line of the matching stage. For example, the image sensor may be used to capture an image of the light emission stripe or the ridge, and then the captured image of the light emission stripe or the ridge is compared with a predetermined image recognition pattern of the light emission stripe or the ridge so as to obtain displacement between them.

According to the first to third methods of the present invention, in the step of adjusting the position and the azimuth of the light emitting element on the matching stage in accordance with the measured linear displacement and angular displacement of the light emission stripe, the light emitting element is moved to correctly adjust the position and the azimuth. It is also possible that the position and the azimuth of the light emitting element is correctly adjusted by moving the matching stage. However, when moving the matching stage, it is necessary to similarly move the position and the azimuth of the mounting member, in order to maintain the relative positional relation between the matching stage and the mounting member.

In the first to third methods of the present invention, the light emitting element implies elements having a light emission stripe, such as the semiconductor laser element, the light emitting diode, and the like. The mounting member implies members, such as the sub mount, the heat sink, the LOP and the like, for mounting the light emitting element.

The first to third methods of the present invention can be applied to a case where the semiconductor laser element C is mounted on the sub mount, the heat sink and the like or a case where the semiconductor laser element C is mounted on the photo-diode to thereby manufacture the LOP. Moreover, it can be applied to a case where the light emitting element mounted on the sub mount is mounted on the heat sink.

In the first to third methods of the present invention, the positioning operation is carried out with reference to a special portion, such as the light emission stripe, the ridge or the like, which is assembled in the light emitting element and keeps accurate positional relation with respect to the light emission point without any position-matching operation with the light emission point. In other words, the ridge positioned at high accuracy with respect to the laser stripe serving as the light emission point of the light emitting element or the light emission point is used as the marker of the light emitting element. Accordingly, when the light emitting element is mounted on the mounting material, the light emission point can be positioned at high accuracy with respect to the mounting portion. Alternatively, it is not necessary to have a marker separately provided. Thus, the manufacturing cost of the light emitting element can be reduced correspondingly.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Embodiments of the present invention will be actually described below in detail with reference to the attached drawings by exemplifying the embodiment.

FIRST EMBODIMENT

Figure 1:
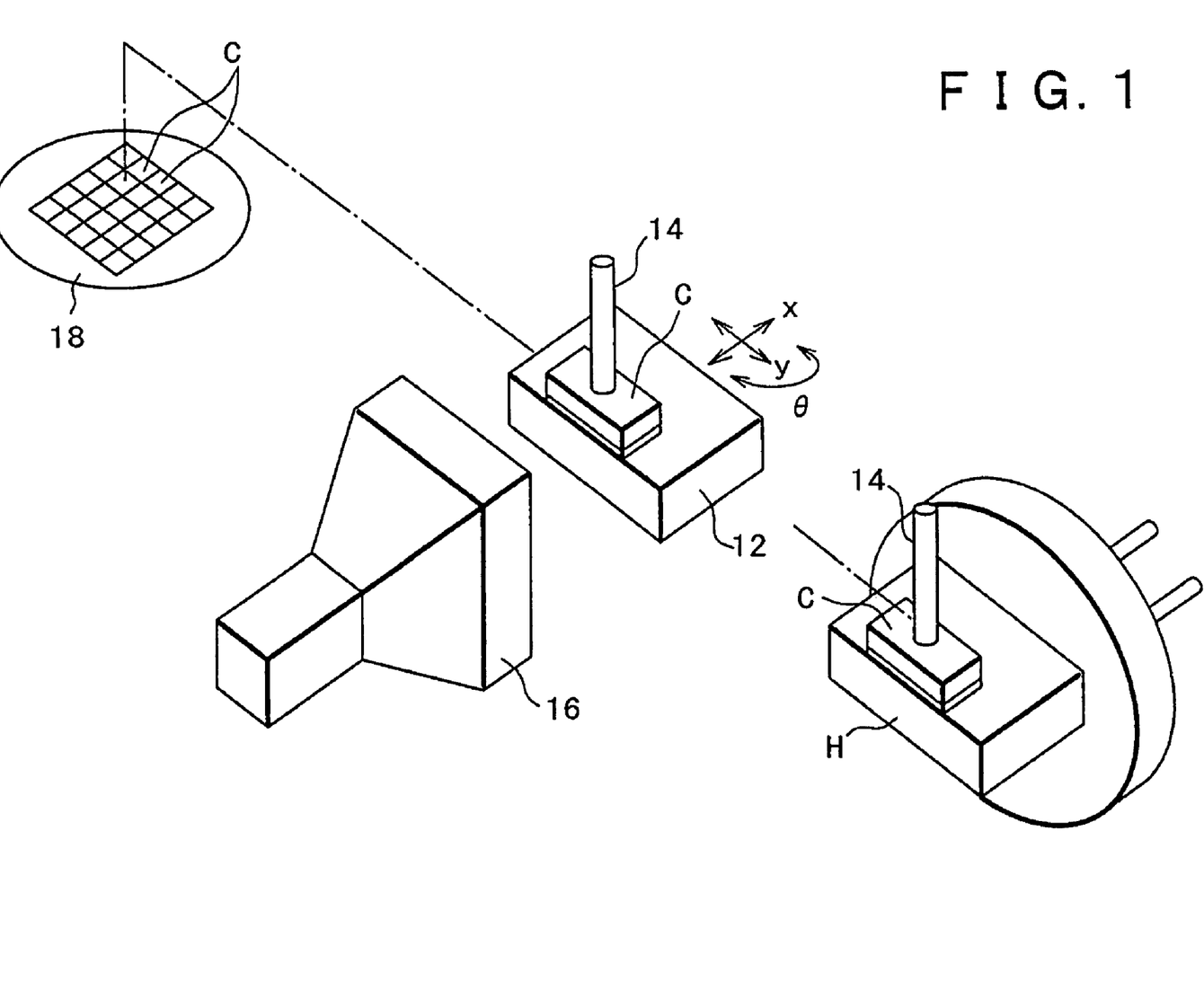
FIG. 1 is a perspective view describing a mounting method when a semiconductor laser element is mounted on a heat sink in accordance with a method of a first embodiment.

The present embodiment is one example of an embodiment of a method of mounting a light emitting element according to a first method of the present invention applied when a semiconductor laser element is mounted on a heat sink. FIG. 1 is a perspective view describing a mounting method when a semiconductor laser element is mounted on the heat sink in accordance with the present embodiment.

According to the method of the present embodiment, a mounting apparatus 10 shown in FIG. 5 is used to position and mount a semiconductor laser element C on a heat sink H. First, as shown in FIG. 1, the semiconductor laser elements C is picked up, one by one, from a tray 18 on which a plurality of chip-shaped semiconductor laser elements C are aligned, using a feeding collet 14. The tray 18 may be a sheet or the other member as far as it can have one or more semiconductor laser element on a surface thereof. The semiconductor laser element C is fed to and placed on the matching stage 12.

Next, the position and the azimuth of the laser stripe of the semiconductor laser element C is observed through the image sensor 16 so as to measure displacement of the semiconductor laser element C from a reference line and a reference point on the matching stage 12, namely, the linear displacement in the X-direction and the Y-direction, and angular displacement in the rotational direction within the X-Y plane or the azimuth (θ).

In accordance with the measured linear displacement in the X-direction and the Y-direction and the measured angular displacement in the rotational direction (θ) within the X-Y plane, a control signal is sent to a driving mechanism (not shown) of the feeding collet 14 so as to drive the feeding collet 14, and the position of the semiconductor laser element C on the matching stage 12 is correctly adjusted.

Next, the semiconductor laser element C after the adjustment in the position and the azimuth is held by the feeding collet 14, moved by the predetermined distance in the predetermined azimuth, and then fed to and placed on a mounting surface of the heat sink H. The heat sink for mounting the semiconductor laser element C is positioned in advance at a position separated in the predetermined azimuth by the predetermined distance from the matching stage 12. Thus, the light emission point can be accurately positioned with respect to the heat sink H in a condition that the semiconductor laser element C is placed on the mounting surface of the heat sink H. Subsequently, the semiconductor laser element C is fixed on the heat sink H.

In the first embodiment, the laser stripe itself serving as the light emission point is used as the marker of the semiconductor laser element C, namely, the reference line. Thus, deterioration in the positioning accuracy of the semiconductor laser element caused by poor positioning accuracy between the marker and the light emission point of the semiconductor laser element, which has occurred conventionally, does not occur.

SECOND EMBODIMENT

The second embodiment is one example of an embodiment of a method of mounting a light emitting element according to the third method of the present invention applied when the GaN-based semiconductor laser element formed on the sapphire substrate is mounted on the heat sink.

When the semiconductor laser element C is the GaN-based semiconductor laser element formed on the sapphire substrate, instead of the laser stripe, the position and the azimuth of a ridge 32 in FIG. 6 as mentioned above may be observed to measure the displacement of the semiconductor laser element C from the reference line and the reference point on the matching stage 12, namely, linear displacement in the X-direction and the Y-direction, and angular displacement in the rotational direction within the X-Y plane or the azimuth (θ).

In the second embodiment, the ridge 32 positioned at high accuracy with respect to the laser stripe serving as the light emission point is used as the marker of the semiconductor laser element C, namely, the reference line. Thus, deterioration in the positioning accuracy of the semiconductor laser element caused by poor positioning accuracy between the marker and the light emission point of the semiconductor laser element, which has occurred conventionally, does not occur.

In the first and second embodiments, when the linear displacement and the angular displacement of the laser stripe from the reference line of the matching stage 12 is measured using the image sensor 16, an image of the laser stripe may be captured through the image sensor 16 to compare a predetermined image recognition pattern of the laser stripe with the captured image of the laser stripe and thereby obtain the displacement.

THIRD EMBODIMENT

Figure 2:
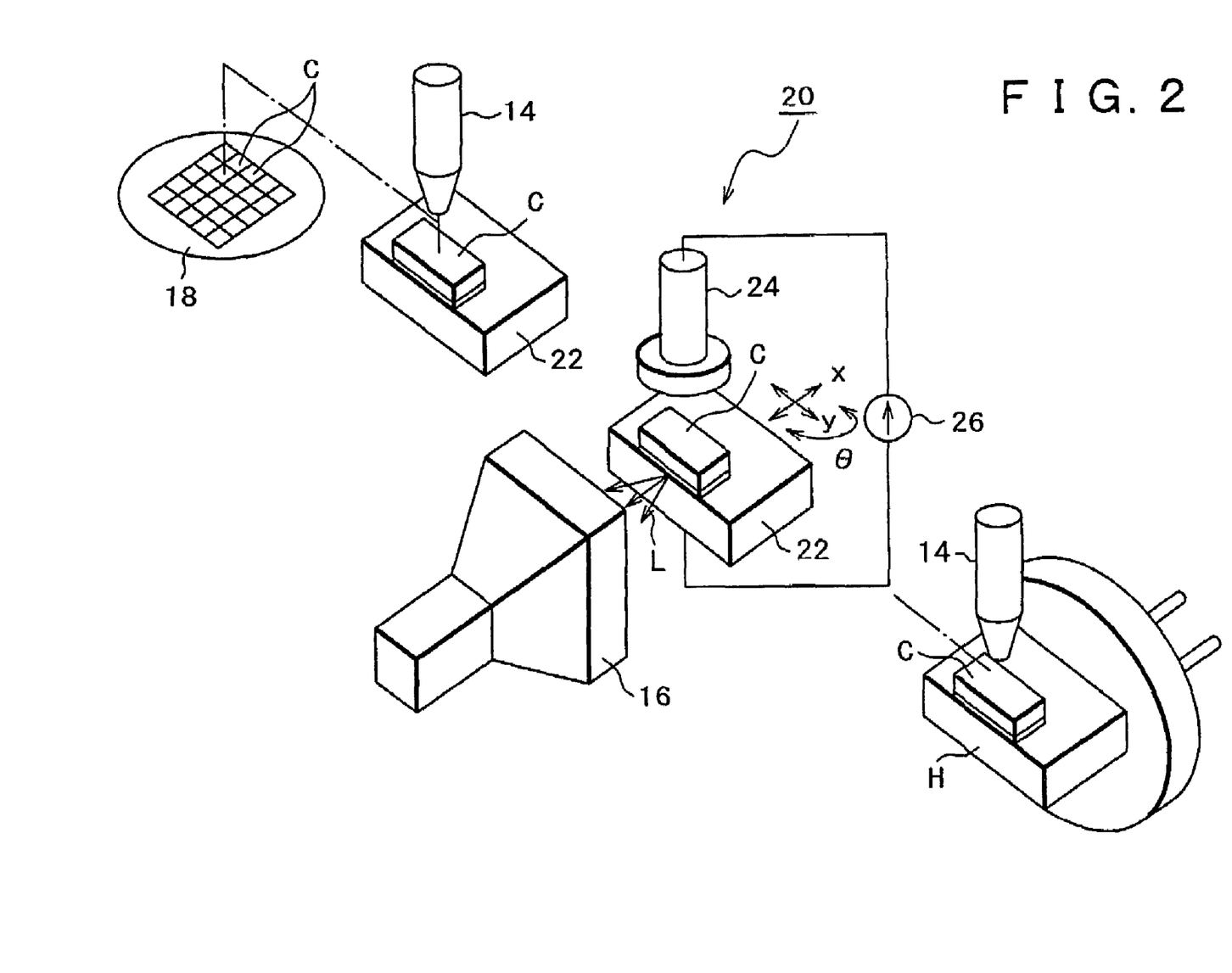
FIG. 2 is a schematic perspective view showing a configuration of an example of a mounting apparatus used when a method of a third embodiment is carried out.

The third embodiment is an example of an embodiment of a mounting method of a light emitting element according to the second method of the present invention applied when a semiconductor laser element is mounted on a heat sink. FIG. 2 is a schematic perspective view showing the configuration of an example of a mounting apparatus used when the method of the present embodiment is carried out.

A mounting apparatus 20 used in the present embodiment method has the configuration basically similar to that of the mounting apparatus 10 used in the first and second embodiments, except that instead of the matching stage 12 of the mounting apparatus 10 used in the first and second embodiments, it has a conductive matching stage 22 having an X-Y plane and made of a conductive material, and also has a conductive collet 24

FIG. 2 shows two conductive matching stages 22, for explanatory convenience's sake. However, actually used is only one conductive matching stage 22 located in front of the image sensor 16.

The conductive matching stage 22 is separated by a predetermined distance in a predetermined azimuth from the heat sink H for mounting the semiconductor laser element C. While sucking and holding the semiconductor laser element C placed on the matching stage 22, the conductive collet 24 can be driven by a driving mechanism (not shown) and freely moved to thereby move the semiconductor laser element C in the X-direction, the Y-direction and the θ-azimuth on the matching stage 22. Also, the conductive collet 24 applies a current to the semiconductor laser element C through the matching stage 22 and the conductive collet 24 from the direct current power supply 26 placed between the matching stage 22 and the conductive collet 24 so that the laser stripe of the semiconductor laser element C emits the lights in the shape of emission lines.

The image sensor 16 may be, for example, the CCD camera. It can detect the laser stripe of the semiconductor laser element C, measure the position and the direction of the laser stripe and detect the displacement in the azimuth θ and the position on the X-Y plane of the semiconductor laser element C from the reference line and the reference point on the X-Y plane of the matching stage 22.

Next, the image sensor 16 sends displacement information to the driving mechanism of the conductive collet 24 so as to drive the conductive collet 24 and to correctly adjust the azimuth and the position of the semiconductor laser element C. The feeding collet 14 sucks the semiconductor laser element C after the azimuth and the position thereof are correctly adjusted, and moves it by a predetermined distance in a predetermined direction, and then places it on the heat sink H.

The method of mounting the semiconductor laser element C on the heat sink H in accordance with the present embodiment will be described below with reference to FIGS. 3A, 3B and FIGS. 4A, 4B. FIGS. 3A, 3B and FIGS. 4A, 4B are perspective views showing steps of mounting the semiconductor laser element C on the heat sink H in accordance with the present embodiment, respectively.

Figure 3A:
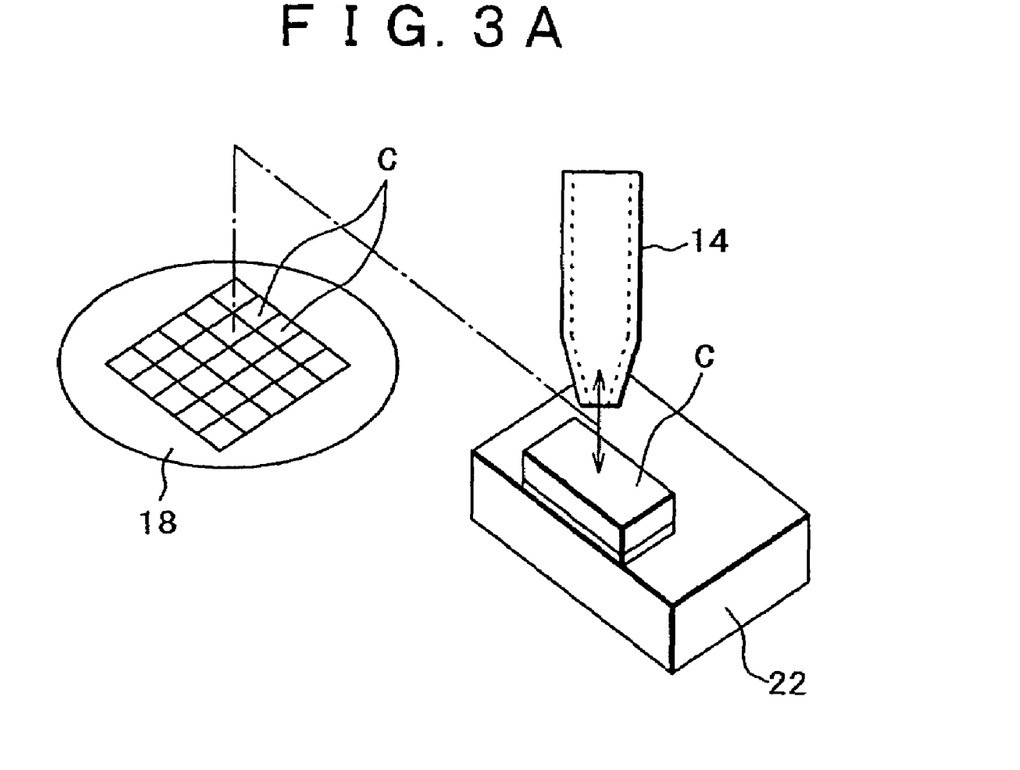
FIGS. 3A, 3B are perspective views showing steps of mounting a semiconductor laser element on a heat sink in accordance with the third embodiment, respectively.

At first, as shown in FIG. 3A, the semiconductor laser element C is picked up, one by one, from a tray 18 on which a plurality of chip-shaped semiconductor laser elements C are aligned, using the feeding collet 14. The semiconductor laser element C is fed to and placed on the matching stage 22 so that a crystal growing layer side thereof faces downward toward the heat sink H. In short, the semiconductor laser element C is placed such that the substrate is positioned on the top portion of the semiconductor laser element C.

Figure 3B:
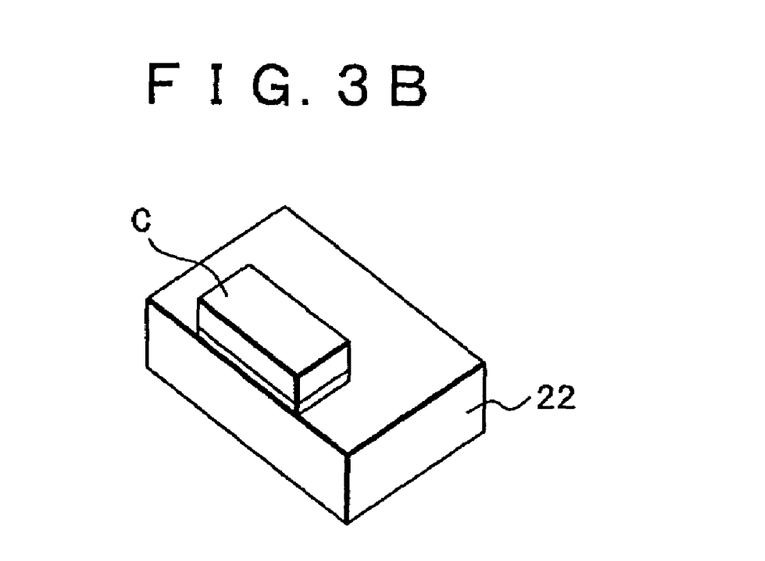

Next, as shown in FIG. 3B, the outer contour of the semiconductor laser element C is used to move the feeding collet 14 and roughly adjust the position and the azimuth of the semiconductor laser element C on the matching stage 22.

Figure 4A:
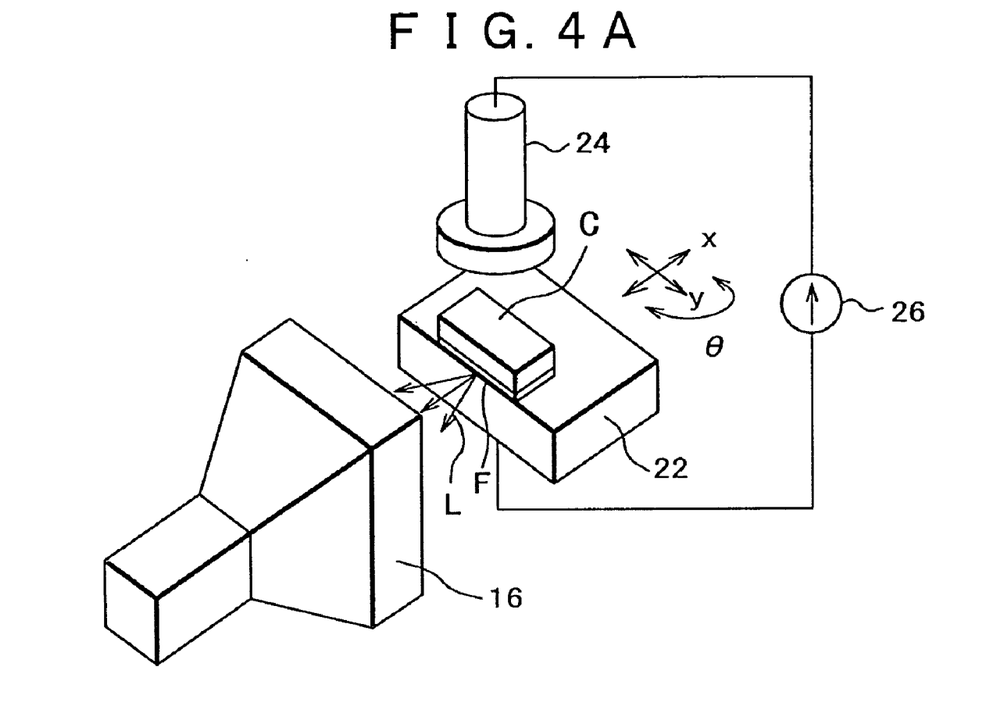
FIGS. 4A, 4B are perspective views showing steps of mounting the semiconductor laser element on the heat sink in accordance with the third embodiment, subsequently to FIG. 3B, respectively.

Subsequently, as shown in FIG. 4A, the semiconductor laser element C on the matching stage 22 is held by the conductive collet 24 and also brought into electrical contact with the collet 24. Then, an electric current is applied from the direct current power supply 26 through the conductive matching stage 22 to the semiconductor laser element C so that the lights are emitted from the laser stripe of the semiconductor laser element C.

Then, the laser stripe, which emits the light and thereby seems to be the emission lines, is detected using the image sensor 16 through the substrate. The linear displacement in the X-direction and the Y-direction of the semiconductor laser element C on the matching stage 22 and the angular displacement in the rotational direction or the azimuth (θ) within the X-Y plane are measured.

In accordance with the measured linear displacement in the X-direction and the Y-direction and the measured angular displacement in the rotational direction (θ) within the X-Y plane, a control signal is outputted to a driving mechanism (not shown) of the conductive collet 24, and the conductive collet 24 is moved to slightly adjust the position of the semiconductor laser element C on the matching stage 22.

Figure 4B:
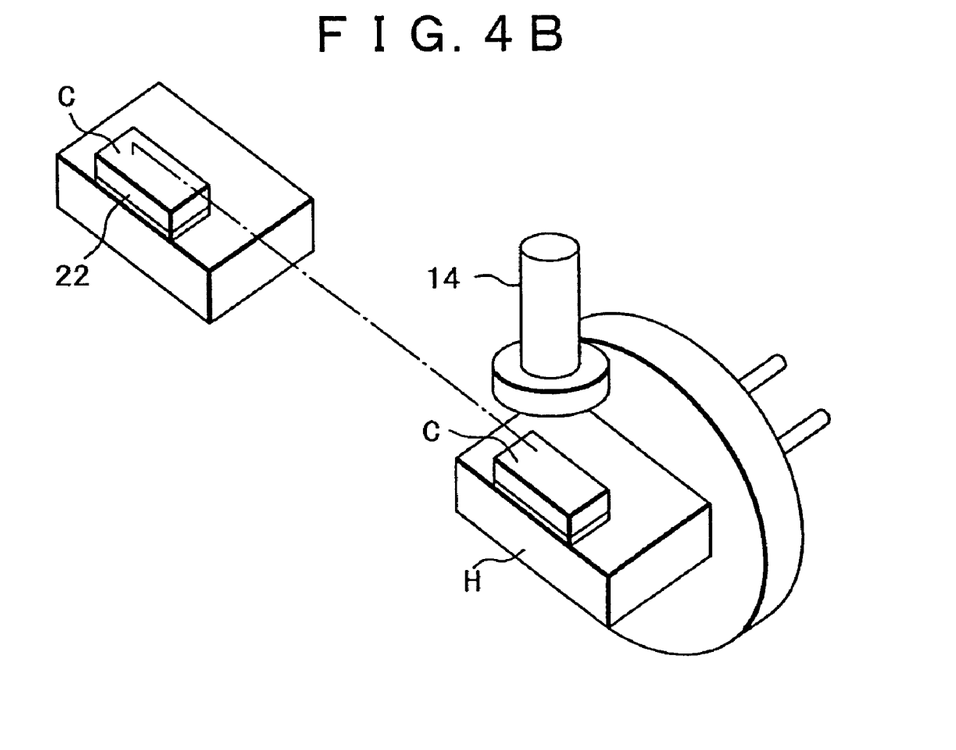

In FIG. 2 and FIGS. 4A, 4B, a light receiving surface of the image sensor 16 is oriented towards an output end plane of the semiconductor laser element C. However, the orientation of the light receiving plane is not limited to it. The image sensor 16 is arranged such that the light receiving surface may be positioned in an orientation in which the laser stripe emitting the lights in a condition that the emission lines can be easily detected.

The semiconductor laser element C after the slight adjustment is held by the feeding collet 14. The feeding collet 14 is moved by a predetermined distance in a predetermined azimuth and placed on the mounting surface of the heat sink H, as shown in FIG. 4B.

A heat sink 26 on which the semiconductor laser element C is mounted is positioned in advance at a position separated by a predetermined distance in a predetermined azimuth from the matching stage 22. Thus, the semiconductor laser element C is accurately positioned in the condition that it is fed onto the mounting surface of the heat sink 26. Subsequently, the semiconductor laser element C is die-bonded on the mounting surface of the heat sink H.

In the third embodiment, when the linear displacement and the angular displacement of the laser stripe with respect to the reference line of the matching stage 22 is measured using the image sensor 16, an image of the laser stripe may be captured through the image sensor 16 to then compare the predetermined image recognition pattern of the laser stripe with the captured image of the laser stripe and thereby obtain the displacement.

In the third embodiment, the laser stripe itself serving as the light emission point is used as the marker of the semiconductor laser element C, namely, the reference line. Thus, deterioration in the positioning accuracy of the semiconductor laser element caused by poor positioning accuracy between the marker and the light emission point of the semiconductor laser element, which has occurred conventionally, does not occur.

Modified Example of Third Embodiment

In the third embodiment described above, the matching stage 22 is fixed, and the position and the azimuth of the semiconductor laser element C on the matching stage 22 are adjusted by the conductive collet 24. However, the present invention is not limited thereto. The matching stage 22 may be moved in the X-direction, the Y-direction and the θ azimuth.

At this time, the laser stripe is observed using the image sensor 16 through the substrate. In order to match the laser stripe with the predetermined image recognition pattern, the matching stage 22 is moved to thereby adjust the X-direction, the Y-direction and the θ azimuth of the matching stage 22.

In a case of moving the matching stage 22, it is necessary to move the heat sink H correspondingly to a movement amount of the matching stage 22.

The modified example of the third embodiment may be designed as described below. That is, instead of the conductive matching stage 22, a transparent matching stage made of a transparent material such as glass is produced. The semiconductor laser element C is placed face-up on the matching stage. The image sensor 16 is placed below the matching stage. A current is applied to the semiconductor laser element C. Then, the laser stripe is observed using the image sensor 16 through the substrate of the semiconductor laser element C and the matching stage.

A probe corresponding to an electrode pattern of the semiconductor laser element C is placed in advance on the transparent matching stage. The image sensor 16 is placed above the matching stage. An electric current is applied by placing the semiconductor laser element C with its face down on the probe. Then, the light emission from the laser stripe is observed through the substrate.

The methods of the first to third embodiments can be applied to the case where the semiconductor laser element C is mounted on the sub mount, the heat sink and the like or the case where the semiconductor laser element C is mounted on the photo-diode to thereby manufacture the LOP.

In the third embodiment and the modification thereof, in a case where the semiconductor laser element already mounted on the sub mount, the LOP or the like is mounted on the heat sink or the like, since the semiconductor laser element is already flip-chip-bonded on the sub mount or the like, they may be designed as follows. That is, the probe is brought into contact with the sub mount, the LOP or the like which is placed on the matching stage 22. The current is applied. Then, the laser stripe is observed using the image sensor 16 through the substrate.

Although the invention has been described in its preferred form with a certain degree of particularity, obviously many changes and variations are possible therein. It is therefore to be understood that the present invention may be practiced otherwise than as specifically described herein without departing from the scope and the spirit thereof.

What is claimed is:

1. A method of mounting a light emitting element, comprising:
    determining a relative position of a light emission stripe based on light generated by the light emitting element after having passed through a transparent side portion of the light emitting element; and
    adjusting a position of said light emitting element based on a difference between an actual position of the light emitting element found during the determining step and a pre-determined preferred location on a mounting member.

2. A method of mounting a light emitting element, comprising:
    applying a current to electrodes of said light emitting element from corresponding contacts of a matching stage, and thereby generating a light emission stripe;
    determining a relative position of the light emission stripe for the light emitting element with respect to a preferred location based on light generated with the light emitting element after having passed through a transparent side structure of the light emitting element; and
    adjusting a position of said light emitting based on a difference between an actual position of the light emitting element found during the determining step and a pre-determined preferred location on a mounting member.

3. A method of mounting a light emitting element, according to claim 1, wherein said step of determining the relative position comprises capturing an image of said light emission stripe, and comparing the captured image of said light emission stripe with the pre-determined preferred location.

4. A method of mounting a light emitting element, according to claim 2, wherein said step of determining the relative position comprises capturing an image of said light emission stripe, and comparing the captured image of said light emission stripe with the pre-determined preferred location.

5. A method of mounting a light emitting element having a ridge, on a mounting member, comprising the steps of:
    placing said light emitting element on a matching stage arranged in a predetermined position relative to said mounting member;
    determining a relative position of said ridge of said light emitting element with respect to a desired position based upon viewing the ridge through a transparent structure of the light emitting element; and
    adjusting a position of said light emitting element on said matching stage, based upon a determined position of the ridge.

6. The method of mounting a light emitting element of claim 5, wherein the light emitting element is a GaN-based light emitting element and the ridge is formed on a sapphire substrate.

7. The method of mounting a light emitting element of claim 5, wherein the transparent structure through which the ridge is viewed in order to determine the relative position of the ridge is a transparent laminated layer structure formed over a substrate.

8. The method of mounting a light emitting element of claim 5, wherein the transparent structure through which the ridge is viewed in order to determine the relative position of the ridge is a transparent substrate.

* * * * *